United States Patent
Kalkan et al.

(10) Patent No.: US 6,919,119 B2
(45) Date of Patent: Jul. 19, 2005

(54) ELECTRONIC AND OPTO-ELECTRONIC DEVICES FABRICATED FROM NANOSTRUCTURED HIGH SURFACE TO VOLUME RATIO THIN FILMS

(75) Inventors: Ali Kaan Kalkan, State College, PA (US); Stephen J. Fonash, State College, PA (US)

(73) Assignee: The Penn State Research Foundation, University Park, PA (US)

(*) Notice: Subject to any disclaimer, the term of this patent is extended or adjusted under 35 U.S.C. 154(b) by 0 days.

(21) Appl. No.: 10/165,858

(22) Filed: Jun. 8, 2002

(65) Prior Publication Data

US 2002/0192441 A1 Dec. 19, 2002

Related U.S. Application Data

(63) Continuation-in-part of application No. 10/144,456, filed on May 13, 2002, which is a continuation-in-part of application No. 10/104,749, filed on Mar. 22, 2002, now abandoned, which is a continuation of application No. 09/580,105, filed on May 30, 2000, now Pat. No. 6,399,177.
(60) Provisional application No. 60/296,857, filed on Jun. 8, 2001.

(51) Int. Cl.[7] ............................. B32B 7/00; H02M 3/06; H02J 17/00
(52) U.S. Cl. ...................... 428/119; 320/166; 320/167; 307/109; 307/110; 977/DIG. 1
(58) Field of Search ................... 257/79–103, 225–234, 257/290–294, 345; 428/119; 320/166, 167; 307/109, 110

(56) References Cited

U.S. PATENT DOCUMENTS

| | | | |
|---|---|---|---|
| 3,972,059 A | * 7/1976 | DiStefano | 257/30 |
| 5,264,722 A | 11/1993 | Tonucci et al. | 257/443 |
| 5,562,516 A | 10/1996 | Spindt et al. | 445/24 |
| 5,567,954 A | * 10/1996 | Dobson et al. | 257/3 |
| 5,747,180 A | 5/1998 | Miller et al. | 428/601 |

(Continued)

FOREIGN PATENT DOCUMENTS

WO    WO 00/74932    12/2000    ............. B23B/3/10

OTHER PUBLICATIONS

WO 02/101352, Published PCT International Application, Publication Date Dec. 19, 2002, PCT/US02/17909 (30626–104PCT).

(Continued)

*Primary Examiner*—Deborah Jones
*Assistant Examiner*—G. Blackwell-Rudasill
(74) *Attorney, Agent, or Firm*—Perkins Smith & Cohen LLP; Peter J. Borghetti; John A. Hamilton

(57) ABSTRACT

An electronic or opto-electronic device or a chemical sensor comprising: an interpenetrating network of a nanostructured high surface area to volume ratio film material and an organic/inorganic material forming a nanocomposite. The high surface area to volume film material is obtained onto an electrode substrate first, such that the nano-scale basic elements comprising this film material are embedded in a void matrix while having electrical connectivity with the electrode substrate. For example, the film material may comprise an array of nano-protrusions electrically connected to the electrode substrate and separated by a void matrix. The interpenetrating network is formed by introducing an appropriate organic/inorganic material into the void volume of the high surface area to volume film material. Further electrode(s) are defined onto the film or intra-void material to achieve a certain device. Charge separation, charge injection, charge storage, field effect devices, ohmic contacts, and chemical sensors are possible.

21 Claims, 3 Drawing Sheets

U.S. PATENT DOCUMENTS

| | | | | |
|---|---|---|---|---|
| 5,879,828 | A | | 3/1999 | Debe et al. .................... 429/41 |
| 6,038,060 | A | | 3/2000 | Crowley ..................... 359/328 |
| 6,057,637 | A | | 5/2000 | Zettl et al. ................... 313/310 |
| 6,172,902 | B1 | * | 1/2001 | Wegrowe et al. ........... 365/158 |
| 6,185,961 | B1 | | 2/2001 | Tonucci et al. .............. 65/60.4 |
| 6,213,744 | B1 | | 4/2001 | Choroszylow et al. ..... 418/61.2 |
| 6,214,195 | B1 | | 4/2001 | Yadav et al. ................ 205/334 |
| 6,548,836 | B1 | * | 4/2003 | Rubner et al. .............. 257/103 |

OTHER PUBLICATIONS

A.C. Arango et al. (1999) "Charge transfer in photovoltaics consisting of interpenetrating networks of conjugated polymer and $TiO_2$ nanoparticles." Appl. Phys. Let. 74 (12) 1698–1700.

S. Spiekermann et al. (2001) "Poly(4–undecyl–2, 2'–bithiophene) as a hole conductor in solid state dye sensitized titanium dioxide solar cells." Synth. Met. 121, 1603–1604.

Kim et al. "Silicon Compatible Organic Light Emitting Diode." J. Lightwave Tech., vol. 12, No., Dec. 1994, 2107–2113.

Halls et al. "Exciton diffusion and disslocation in a poly(p–phenylenevinylene)/C60 heterojunction photovoltaic cell." Appl. Phys. Lett. 68 (22), May 27, 1996, 3120–3122.

Marks et al. "The photovoltaic response in poly(p–phenylene vinylene) thin–film devices." J. Phys.: Condens. Matter 6 (1994) 1379–1394, no month.

Greenham et al. "Charge separation and transport in conjugated–polymer/semiconductor–nanocrystal composites studied by photoluminescence quenching and photoconductivity." Phys. Rev. B, vol. 54, No. 24, Dec. 15, 1996, 17628–17637.

Sariciftci et al. "Photoinduced electron transfer from a conducting polymer to Buckminsterfullerene." Science, New Series, vol. 258, Issue 5087 (Nov. 27, 1992), 1474–1476.

\* cited by examiner

ELECTRONIC AND OPTO-ELECTRONIC DEVICES FABRICATED FROM NANOSTRUCTURED HIGH SURFACE TO VOLUME RATIO THIN FILMS

This application claims priority from U.S. Provisional Application No. 60/296,857, filed Jun. 8, 2001 and U.S. patent application, Ser. No. 10/144,456, filed on May 13, 2002, which is a Continuation-In-Part of U.S. patent application, Ser. No. 10/104,749, filed on Mar. 22, 2002, which is a Continuation of U.S. patent application, Ser. No. 09/580,105, filed on May 30, 2000, now U.S. Pat. No. 6,399,177.

BACKGROUND OF THE INVENTION

1. Field of the Invention

The present invention generally relates to a novel production method for the production of electronic and opto-electronic devices from an interpenetrating network configuration of nano structured high surface to volume ratio porous thin films with organic/inorganic metal, semiconductor or insulator material positioned within the interconnected void volume of the nano structure.

2. Description of the Prior Art

Today nanoparticles are proposed for, and used for, providing a high surface area to volume ratio material. Besides the large surface area they provide, nanoparticles can be embedded in organic/inorganic semiconductor/insulator materials (nano composite systems) to obtain a high interface area that can be exploited in, for example, the following optoelectronic and electronic applications: (a) charge separation functions for such applications as photovoltaics and detectors; (b) charge injection functions for such applications as light emitting devices; (c) charge storage functions for capacitors; and (d) ohmic contact-like functions for such applications as contacting molecular electronic structures.

There are difficulties with nanoparticles, however. These include their handling and, for electronic and opto-electronic uses, they also include the question of how to achieve electrical contact. The present invention solves these two problems by using deposited nanostructured high surface to volume ratio materials. These materials allow a manageable high interface area which is easily contacted electrically.

In the present approach for making optoelectronic devices from nanoparticle composite systems isolated nanoparticles are diffused into a matrix of organic material. Ideally, each nanoparticle or nanoparticle surface must be electrically connected to the outside (by a set of electrodes) for electrical and opto-electronic function. This is best achieved if the nanoparticles are arranged so that they are interconnected to the electrodes providing continuous electrical pathways to these particles. However, in the present art with the use of isolated nanoparticles, these particles will often fail to make good electrical contacts even if the volume fraction of nanoparticles is made close to unity.

In this invention a different approach is proposed to avoid this problem. This approach involves formation of a thin film of a nanostructured high surface area to volume ratio material on an electrode substrate or a patterned set of electrodes on a substrate. The basic elements (building blocks) of this nanostructure are embedded in an interconnected void matrix with the attributes of high surface to volume ratio but with electrical connectivity to the substrate electrode. Once the interconnected void network of this film material is filled with a secondary material a composite is formed with high interface area. Furthermore, each component of the composite structure is conformally connected. Hence, any region of the composite system including the interface has continuous electrical connection to the outside.

SUMMARY OF THE INVENTION

A method of fabricating an electronic/optoelectronic device from an interpenetrating network of a nanostructured high surface area to volume ratio material and an organic/inorganic matrix material comprising the steps of: a) obtaining a high surface area to volume ratio film material onto an electrode substrate (or a patterned electrode substrate), such that any region of this film material is in electrical connectivity with the electrode substrate by virtue of the morphology. For example, the film material may comprise an array of nano and/or micro-protrusions electrically connected to the electrode substrate and separated by a void matrix; b) filling the void matrix of the high surface to volume film with an organic/inorganic solid or liquid material; and c) defining an electrode or set of electrodes onto the organic or inorganic intra-void material embedded in said void matrix.

The basic elements of the high surface area to volume film material can be selected from the group consisting of: nanotubes, nanorods, nanowires, nanocolumns or aggregates thereof, oriented molecules, chains of atoms, chains of molecules, fullerenes, nanoparticles, aggregates of nanoparticles, and any combinations thereof.

The organic/inorganic intra-void material is at least one selected from the group consisting of: organic semiconductor material, organic insulator material, inorganic semiconductor material, inorganic insulator material, conjugated polymers, metals, organometallics, self assembling molecular layers and any combinations thereof.

The high surface area to volume porous film is preferably deposited onto the conductive (electrode) substrate or on a patterned substrate by, for example, chemical vapor deposition, plasma-enhanced chemical vapor deposition, physical vapor deposition, or electrodeposition. Or it may be obtained by electrochemical etching.

The organic or inorganic intra-void material may be applied into the void matrix in liquid form, molten form, as dissolved in a solvent, or by electrochemical means. Additionally, the intra-void material may be embedded into the void matrix by exposing the film material to the vapor of the intra-void material, thus causing the vapor to condense inside the void matrix.

The interpenetrating network of nanostructured high surface area to volume ratio material and intra-void material may be used for fabricating a charge separation and collection device such as a chemical sensor, photodetector or a photovoltaic device.

The network may also be used for fabricating a charge injection device such as an electroluminescent device.

The interpenetrating network of nanostructured high surface area to volume ratio material and organic/inorganic intra-void material may also be used for fabricating a charge storage device (capacitor).

The nanostructured high surface area to volume ratio material may also be used as an ohmic-like contact to the intra-void material.

The interpenetrating network of nanostructured high surface area to volume ratio material and intra-void material may further be used to fabricate an electronic device in which the electronic current through the nano-scale basic elements of the film (charge transport paths) are regulated by the electric potential applied to the filling material surrounding the nano-scale basic elements or vice versa. This electronic device functions as a field effect-type transistor.

Other features and advantages of the present invention will be apparent from the following detailed description and from the claims.

DETAILED DESCRIPTION OF THE INVENTION

The present invention is directed to a method for fabricating an interpenetrating network of a nanostructured high surface area to volume ratio material and an organic or inorganic intra-void material comprising: a) obtaining a high surface area to volume ratio film material onto an electrode substrate (or a patterned electrode substrate), such that any region of this film material is in electrical connectivity with the electrode substrate by virtue of the morphology. For example, the film material may comprise an array of nano and/or micro-protrusions electrically connected to the electrode substrate and separated by a void matrix; b) filling the void matrix of the high surface to volume film with an organic/inorganic solid or liquid material; and c) defining an electrode or set of electrodes onto the organic or inorganic intra-void material embedded in said void matrix.

The basic elements of the high surface area to volume film material can be selected from the group consisting of: nanotubes, nanorods, nanowires, nanocolumns or aggregates thereof, oriented molecules, chains of atoms, chains of molecules, fullerenes, nanoparticles, aggregates of nanoparticles, and any combinations thereof. The basic elements of the high surface area to volume film comprises a material selected from the group consisting of: silicon, silicon dioxide, germanium, germanium oxide, indium, gallium, cadmium, selenium, tellurium, and alloys and compounds thereof, carbon, hydrogen, semiconductors, insulators, metals, ceramics, polymers, other inorganic material, organic material, or any combinations thereof.

The organic/inorganic filling material may comprise a semiconductor, an insulator, a metal, an organometallic, a self assembling molecular layer, a conjugated polymer, and any combinations thereof.

The high surface area to volume porous film is preferably deposited onto the conductive (electrode) substrate or on a patterned substrate by, for example, chemical vapor deposition, plasma-enhanced chemical vapor deposition, physical vapor deposition, or electrodeposition. Or it may be obtained by electrochemical etching.

The organic or inorganic intra-void material may be applied into the void matrix in liquid form, molten form as dissolved in a solvent, or by electrochemical means. Additionally, the intra-void material may be embedded into the void matrix by exposing the film material to the vapor of the intra-void material, thus causing the vapor to condense inside the void matrix.

Figure 1:
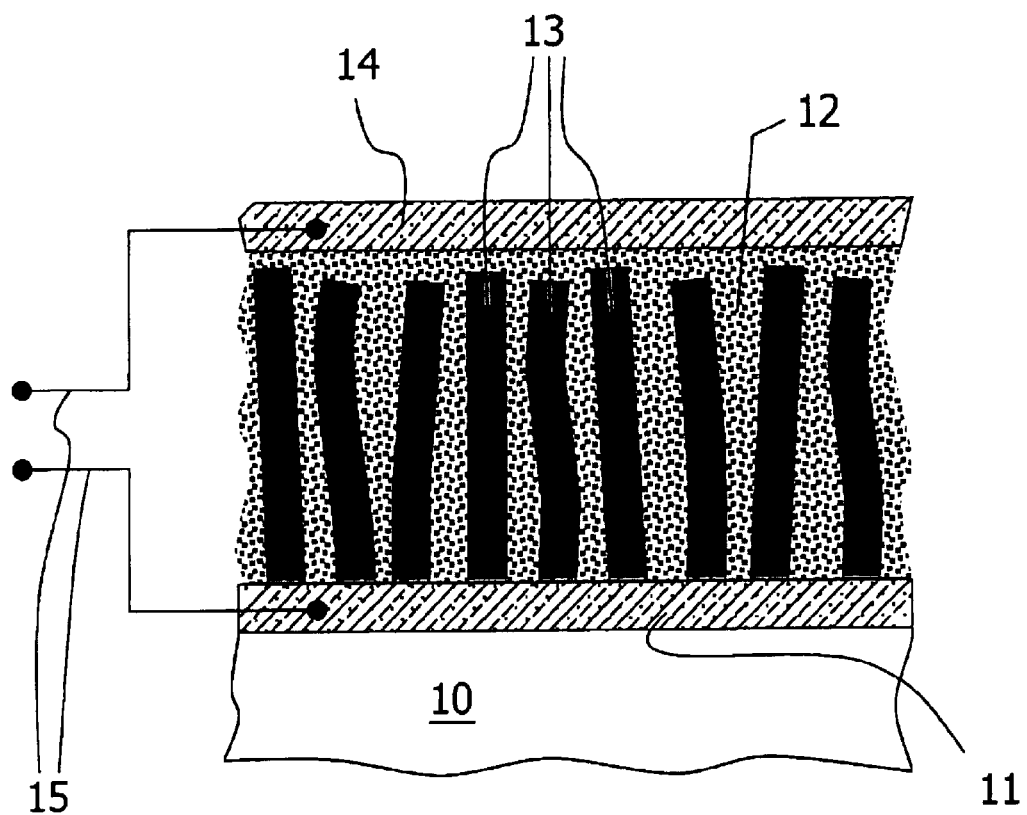
FIG. 1 is an electronic/optoelectronic device fabricated from an interpenetrating network of a nanostructured thin film and an organic semiconductor/insulator material with a large interface.

Referring now to FIG. 1, there is shown a schematic representation of an electronic or opto-electronic device. The device is fabricated from an interpenetrating network of a nanostructured thin film and a metal, semiconductor, or insulator material forming a large interface area. The high surface to volume thin film material consisting of an array of nano-protrusions 13 separated by voids is first formed on a conductive substrate or a conductive layer 11 on a substrate 10 (electrode). Here, the basic elements of the high surface to volume film are nano-protrusions as an example. However various other morphologies are possible as long as the nano-scale basic elements each have a continuous charge conduction path to the substrate electrode. Then the void volume is filled with an appropriate organic/inorganic metal, semiconductor or insulator inter-void material 12. Finally, an appropriate electrode 14 (or set of electrodes) is defined onto the inter-void material. Thereby each material (nanoprotrusions and matrix) is conformally connected to its own electrode. Contacts to electrodes 15 provide connection to the outside world.

Figure 2:
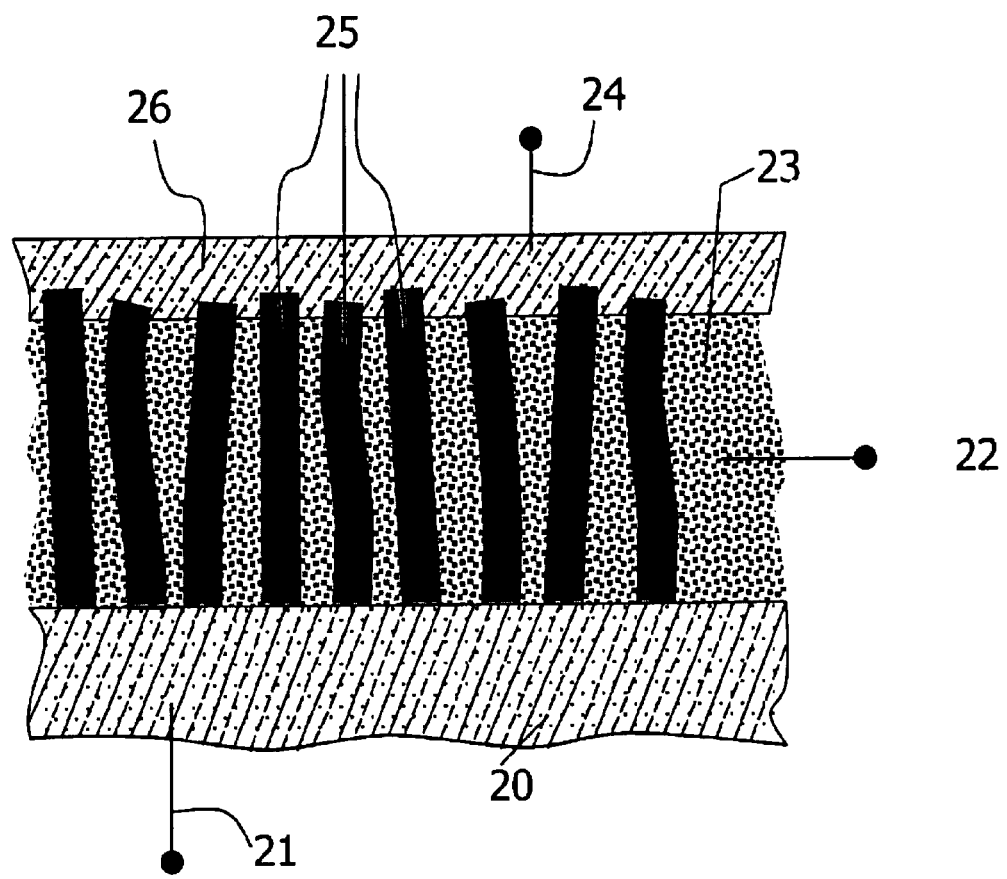
FIG. 2 is a field effect device according to the present invention.
Figure 3:
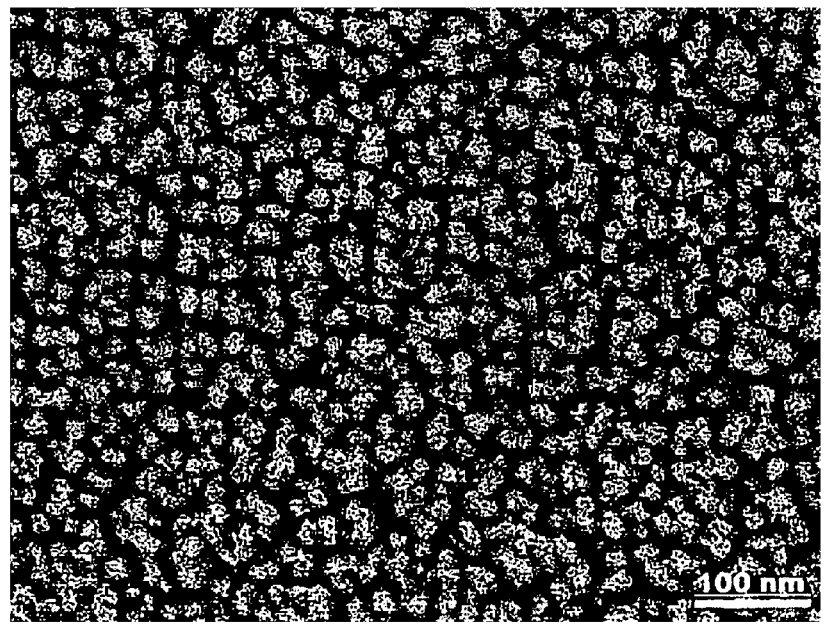
FIG. 3 is a scanning electron microscope view of a nanostructured high surface to volume column void network Si film deposited by high density plasma on a highly conductive (approximately 100 S/cm)<100> Si substrate. The film was grown at 10 mTorr, 100° C., 400 W, using 40 sccm $H_2$ and 2 sccm $SiH_4$ for 10 minutes.

Referring to FIG. 2, a wafer (p+Si) 20 is a source (+) 21. Al 26 is a drain (0) 24. Tri-p-tolylamide 23 provides a gate (−) 22. Silicon nano-protrusions (n-type) 25 are shown in this embodiment.

In the devices of the present invention, the nanostructured film material is a comprised of nano-scale basic elements each with the attributes of (1) high surface to volume ratio and (2) electrical connectivity to the substrate electrode. The nano-scale basic elements (e.g., nanowires, nanocolumns, etc.) are separated by voids, or equivalently they are embedded in an interconnected void matrix. FIG. 1 illustrates an example where the film consists of an array of protruding nanocolumns, nanowires, or nanotubes aligned nearly perpendicular to the substrate electrode. These nano-building-elements can also be in clusters of sub-elements (e.g., nanoparticles, nanofibers, etc.) that form various nanostructures such as regular nanocolumn or nanowire arrays or fractal coral-like morphologies. Or, each element can be in the form of a single nanotube or nanowire or a chain of atoms/molecules (i.e., oriented giant molecules).

In the approach of this invention, after the formation of the film of nano-scale elements, the organic/inorganic based appropriate semiconductor, metal or insulator intra-void material can be introduced into the void matrix. Here, the intra-void material can be applied into the high surface to volume film in liquid form, molten, as dissolved in a solvent or by electrochemical means. Furthermore, the intra-void material can be filled into the voids by exposing the high surface to volume film to the vapor of the intra-void material and subsequent capillary condensation of the vapor inside the voids. Once the intra-void material occupies the void network inside the solid porous film, it forms a nanostructured network. Hence each material interpenetrates each other with a nanostructured network creating a large interface area.

To complete the fabrication of a chemical sensor, electronic or opto-electronic device, a step finally defining an appropriate electrode to the intra-void material would be undertaken. Thus, the resulting composite nanostructure consists of an interpenetrating network of a nanostructured thin film and a metal/semiconductor/insulator material with a large interface. In this approach of this invention, each material (high surface to volume film and intra-void material) is conformally connected to its own electrode. A representative illustration of this approach is given in FIG. 1.

The invention is further illustrated by the following examples which are intended for illustration and not for limitation of the scope thereof.

EXAMPLE 1
(Charge Separation and Photovoltaics)

Organic semiconductor materials are also called molecular semiconductors since the building blocks are single organic molecules or conjugated polymer molecules. In molecular semiconductors, photoexcitation creates electron-hole pairs which are strongly bound (e.g., approximately 0.4 eV in poly(p-phenylenevinylene)). Charge collection requires the separation of electron and hole into free carriers.

An exciton (electron-hole pair) can efficiently be split at interfaces between materials with different electron and hole affinities and ionization potentials, where electron is captured by the higher electron affinity side and hole by the lower hole affinity side. Unfortunately, the lifetime of exciton is short (100–1000 ps), so only excitons created within approximately 10 nm of the interface will ever reach it. Accordingly, charge collection directly scales with the interface area, which must be large per unit of light penetrating cross sectional area. Furthermore, optimum charge collection occurs if continuous conduction pathways are provided to the electrodes for electrons and holes from the interfaces, where they are separated.

Hence, an efficient charge separation and collection device may be fabricated from interpenetrating nanostructured thin films and organic semiconductors. For example, the high electron affinity difference between inorganic semiconductors (approximately 4 eV) and most organic semiconductors (approximately 3 eV) ensures efficient charge separation at the interface as long as the band gap of the inorganic semiconductor is not smaller than that of the organic semiconductor by the electron affinity difference. Furthermore, the nanostructured thin film/organic interface will provide an interconnected and extremely large surface for efficient charge photogeneration, separation and collection.

The interpenetrating network of both inorganic and organic will provide continuous conduction pathways for electrons and holes to the electrodes. Also, if such a structure is operated with the two electrodes biased, the device will also function as a photodetector. If such a structure is operated under bias and if it is penetrated by adsorbed species, the device will function as a sensor if such penetration changes the device response.

Our approach of a thin film of protrusions (of nanoparticles or clusters of nanoparticles) with high surface to volume ratio has many advantages over the use of individual nanoparticles, as is practiced in the art. For example, Greenham et al. have reported a photovoltaic device based on CdSe nanocrystals embedded in a matrix of a semiconductor polymer, poly(2-methoxy,5-(2'-ethyl-hexyloxy)-p-phenylenevinylene). Both materials are semiconductors with band-gaps of about 2 eV, but the electron affinity of the nanocrystals is much greater than that of the polymer. As a result, electron-hole pairs generated by photons (either in the nanocrystals or the polymer) rapidly separate with the hole residing on the polymer and the electron on the nanocrystals. Then, free holes move along the polymer phase (diffusion or drift), while free electrons hop (tunnel) from nanocrystal to nanocrystal until they are collected at electrodes.

In this device, the mechanism of electron transport being tunneling between nanocrystals (i.e., effectively a slow process) limits the collection efficiency of electrons. Slow transport of electrons also increases their probability of recombining with holes before being collected. As a result of this poor carrier collection, the highest quantum efficiency achievable with this discrete nanoparticle approach was only around 12% (i.e., 12% at 514 nm).

On the other hand, if the nanocrystals have continuous electrical conduction pathways down to the electrode as proposed in this invention, transport of electrons will not involve tunneling, and they will be transported efficiently by drift or diffusion from where they are photogenerated to where they are collected. Consequently, a higher quantum efficiency can be achieved.

EXAMPLE 2
(Charge Injection and Light Emitting Devices)

An attractive feature associated with the large interface formed by interpenetrating network of nanostructured thin films and organic/inorganic semiconductors is that a very effective electrical contact can be made between the nanostructured film material and the intra-void material. Therefore, light emitting devices can be designed based on efficient carrier injection and subsequent radiative recombination or based on carrier excitation.

On the other hand, the electron affinity or the hole affinity difference between the two materials at the interface may not be in favor of charge injection and rather impede the transport. In this situation, a high band gap layer (e.g., silicon oxide, silicon nitride), which is thin enough (i.e., 20–60 Å) for carriers to tunnel can be placed at the interface. Since the voltage drop and band bending will mostly occur across this high band-gap layer, the conduction band edge (or the valence band edge) of the film material can be aligned with the lowest unoccupied molecular orbital (or the highest occupied molecular orbital) of the organic semiconductor material enabling an efficient carrier injection (i.e., by tunneling through the high band-gap material).

EXAMPLE 3
(Charge Capacitors)

Two conducting nanostructured layers can be made to sandwich an insulating layer to form a charge capacitor with a high capacitance due to the high surface area of the two layers (electrodes). In this application, the insulating layer should be thin enough to enable electric fields at highly oblique angles between the two electrode surfaces so that the effective capacitor area is close to that of the interface. However, the insulating layer should also be thick enough to prevent significant charge (current) leakage across electrodes.

A variety of structures can be considered to fabricate such a capacitor device with the approach of this invention. As an example, the following procedure can be taken: (1) deposition of a highly conductive and porous nanostructured Si thin film with an interconnected void volume (first electrode), (2) coating of the inner surface of the Si film with an oxide by oxidation (i.e., thermal, anodic, or plasma oxidation) or by molecular self-assembly (insulating layer), and (3) filling the void volume with a high conductivity organic semiconductor material conformally covering the oxide surface (second electrode). An organometallic can also be used instead of the organic semiconductor material with a further step of annealing to convert it to a metal.

Additionally, only one of the electrodes could be made to have nanostructured surface (high surface area). This can simply be obtained as follows: after the step (1) as above, the void volume of the film material can be filled with an organic insulator, which will planarize the film surface. Then a planar conductive layer is deposited on the organic layer as the second electrode. Furthermore, the deposited nanostructured porous film can be an insulator deposited on an electrode, or can be made an insulator after deposition by further processing (e.g., Si can be oxidized to obtain $SiO_2$). Then a conductive organic material can be applied on the insulating film filling the void volume to generate the second electrode, which will be nanostructured and with a large surface area.

EXAMPLE 4
(Ohmic-like Contacts)

The nanostructured high surface to volume films of this invention are ideal for forming ohmic-like contacts to materials systems, in general. This is because their high surface allows many points for carrier transfer. In addition the high field that can exist at the nano-scale features of these films can give rise to locally very high electric fields and to tunneling. This ohmic contact role of these films can be combined with their ability to affix molecules to allow our films to serve as ohmic contacts in molecular electronics. This affixing and electrical contacting of molecules can be forced to take place in prescribed locations by patterning techniques and masking.

EXAMPLE 5
(Field Effect Devices)

A field effect device can be fabricated from the composite nanostructure described in this invention wherein the electric current through said nanoprotrusions of the porous film is regulated by varying the electric potential of the intra-void material surrounding the nanoprotrusions. In this case, the nanoprotrusions must be connected to a second electrode in addition to the electrode at their base for the flow of electric current and therefore the resulting device consists of three electrical contacts. Therefore, the nanoprotrusions serve as the channel and the electrodes they are connected to as source and drain, whereas at least a portion of the intra-void material serves as the gate of this field effect transistor. While at least a portion of the intra-void material must be a good electrical conductor (gate), any currents between the gate and channel, source or drain will be leakage currents and therefore must be minimized. This can be achieved by isolating the conducting intra-void material from other regions with a high band-gap material layer at the interfaces. For example, if the nano-protrusions are Si, their surface may be oxidized to insulate them from the filling material (gate) with an interfacial silicon oxide layer. Alternatively, self assembling molecules can be attached to the interface to serve as the required insulator layer. Another approach would be to use a highly doped high band-gap material for the filling material (gate). This will ensure a uniform electric potential throughout the gate material, while the leakage currents will be minimized due to either band offsets or depletion of minority carriers in the gate material. FIG. 2 depicts an example device with Si nanoprotrusions and tri-p-tolylamine, a highly doped high band-gap material, as the filling material (gate). Here when the gate is negatively biased it will invert the Si protrusions to be hole carriers and significantly enhance the hole current from source (p Si) to drain (Al) (turning on the transistor). The leakage hole currents from Si or Al to tri-p-tolylamine will be impeded by the significant differences in ionization potentials at the interfaces (>1 eV). On the other hand, the leakage electron currents from tri-p-tolylamine to Si or Al will be insignificant, since tri-p-tolylamine is a hole transport material and is depleted of electrons.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

EXAMPLE 6
(Chemical Sensors)

A structure based on this concept of the electrically contacted high surface to volume film and intra-void material with its electrical contact(s) such as seen in FIG. 1 can also be used as a chemical sensor. Sensing will occur when the species to be detected interact with the intra-void material thereby modifying its electrical or dielectric properties resulting in a change in the ac or dc behavior observed though the electrical contacts.

What is claimed is:

1. An electronic or opto-electronic device comprising:
   a first conductive layer;
   a nanostructured high surface area to volume ratio film material disposed on said first conductive layer, such that nano-scale elements of said film material are disposed in an interconnected void matrix and wherein each said nano-scale element has electrical connectivity with the said first conductive layer;
   an organic or inorganic intra-void material filled into said continuous void volume of said nanostructured high surface area to volume ratio film defining an interface between the intra-void material and each of the nano-scale elements; and
   a second conductive layer electrode in contact with said intra-void material;
   wherein charge separation, charge injection or charge storage occurs at said interface.

2. The electronic or opto-electronic device of claim 1, wherein said first and second conductive layers are at least one material selected from the group consisting of: semiconductors, glasses, plastics, polymers, metals, ceramics, partially conducting insulators, organic materials, inorganic materials, or any combinations thereof.

3. The electronic or opto-electronic device of claim 1, wherein said nano-scale elements are at least one selected from the group consisting of: nanotubes, nanorods, nanowires, nanocolumns or aggregates thereof, oriented molecules, chains of atoms, chains of molecules, nanoparticles, aggregates of nanoparticles, and any combinations thereof.

4. The electronic or opto-electronic device of claim 1, wherein said organic and inorganic material is at least one selected from the group consisting of: organic semiconductor material, organic insulator material, inorganic semiconductor material, inorganic insulator material, conjugated polymers, metals, organometallics, self assembling molecular layers and any combinations thereof.

5. The electronic or opto-electronic device of claim 1, wherein said electronic or opto-electronic device is selected from the group consisting of charge separation and photovoltaic devices, charge injection and electroluminescent devices; charge capacitor devices, ohmic-like contact devices, and field effect devices.

6. The electronic or opto-electronic device of claim 1, wherein said nano-scale elements are formed of a material selected from the group consisting of: silicon, silicon dioxide, germanium, germanium oxide, indium, gallium, cadmium, selenium, tellurium, and alloys and compounds thereof, carbon, hydrogen, semiconductors, insulators, metals, ceramics, polymers, other inorganic material, organic material, or any combinations thereof.

7. The electronic or opto-electronic device of claim 1, wherein said nano-scale elements have a diameter of between about 1 to 50 nm.

8. The electronic or opto-electronic device according to claim 1, wherein said nano-scale material is deposited.

9. The electronic or opto-electronic device according to claim 8, wherein said nano-scale material is formed by at least one process selected from the group consisting of: chemical vapor deposition, physical vapor deposition, electrochemical etching and electrode position.

10. The electronic or opto-electronic device according to claim 1, wherein said deposited nano-scale material is formed by means comprising use of a high-density plasma.

11. The electronic or opto-electronic device according to claim 1, wherein said electronic or opto-electronic device is a light emitting device and wherein a high band gap layer having a thickness of between about 20–60 Å is disposed between the interface between said nano-scale material and said an organic or inorganic intra-void material.

12. The electronic or opto-electronic device according to claim 1, wherein said nano-scale composition has a thickness greater than 10 nm.

13. The electronic or opto-electronic device according to claim 1, wherein said nano-scale elements are rod-like perturbations that are agglomerations of adjustably sized columnar-like clusters adhered to said first conductive layer.

14. The electronic or opto-electronic device according to claim 1, wherein the interface between said nano-scale material and said organic material provides an interconnected surface for charge photogeneration, separation and collection.

15. The electronic or opto-electronic device according to claim 1, wherein said organic or inorganic material provides a continuous conduction pathway for electrons and holes to said first and second conductive layers.

16. The electronic or opto-electronic device according to claim 1, wherein said first and second conductive layers are biased, whereby said device functions as a photodetector.

17. A charge capacitor comprising:
a first conductive layer;
a nano-scale composition comprising a plurality of polycrystalline or amorphous rod-like perturbations penetrating a continuous void, wherein said plurality of rod-like perturbations are uniformly orientated and adhered to said first conductive layer;
an organic or inorganic intra-void material disposed within continuous void of said nano-scale composition; and
a second conductive layer conformally covering said insulating material disposed within said continuous void of said nano-scale composition.

18. The charge capacitor according to claim 17, wherein said first conductive layer is silicon and said second conductive layer is either an organic semiconductor material or an organometallic material.

19. An electronic or opto-electronic device comprising:
a first conductive layer;
a nano-scale composition comprising a plurality of polycrystalline or amorphous rod-like perturbations penetrating a continuous void, wherein said plurality of rod-like perturbations are uniformly orientated and adhered to said first conductive layer;
an insulating material disposed within continuous void of said nano-scale composition; and
a second conductive layer conformally covering said insulating material disposed within said continuous void of said nano-scale composition.

20. The electronic of opto-electronic device of claim 19, wherein the device is a charge capacitor.

21. The electronic or opto-electronic device according to claim 1, wherein said nano-scale composition has a thickness greater than 1 nm.

* * * * *